US006538881B1

(12) United States Patent
Jeakins et al.

(10) Patent No.: US 6,538,881 B1
(45) Date of Patent: Mar. 25, 2003

(54) COOLING OF ELECTRONIC EQUIPMENT

(75) Inventors: William David Jeakins, Kanata (CA);
William Joseph Michael Moizer, Nepean (CA)

(73) Assignee: Alcatel Canada Inc., Kanata (CA)

( * ) Notice: Subject to any disclaimer, the term of this patent is extended or adjusted under 35 U.S.C. 154(b) by 0 days.

(21) Appl. No.: 09/591,487

(22) Filed: Jun. 12, 2000

(51) Int. Cl.[7] ................................................. H05K 7/20
(52) U.S. Cl. ........................ 361/687; 361/695; 361/727; 165/122; 454/184
(58) Field of Search ........................ 361/683, 685–688, 361/692–697, 724–727, 752; 165/80.3, 122, 126, 106.32, 104.33, 104.34, 165; 174/15.1, 16.1; 454/184; 364/708.1; 312/223.2

(56) References Cited

U.S. PATENT DOCUMENTS

| | | | | | |
|---|---|---|---|---|---|
| 3,253,646 A | * | 5/1966 | Koltuniak et al. | ............ | 165/39 |
| 3,364,838 A | * | 1/1968 | Bradley | .......................... | 98/33 |
| 3,749,981 A | * | 7/1973 | Koltuniak et al. | .......... | 317/100 |
| 4,644,443 A | * | 2/1987 | Swensen et al. | ............ | 361/384 |
| 5,800,258 A | * | 9/1998 | Knoop | ........................ | 454/184 |
| 5,949,646 A | * | 9/1999 | Lee et al. | .................... | 361/695 |
| 6,000,623 A | * | 12/1999 | Blatti et al. | ................. | 236/49.3 |
| 6,198,628 B1 | * | 3/2001 | Smith | ......................... | 361/695 |
| 6,341,064 B1 | * | 1/2002 | Bradley | ....................... | 361/695 |

FOREIGN PATENT DOCUMENTS

| | | | | | |
|---|---|---|---|---|---|
| JP | 401191499 A | * | 8/1989 | ............ | H05K/7/20 |
| JP | 406195155 A | * | 7/1994 | ............ | G06F/1/20 |
| JP | 408137579 A | * | 5/1996 | ............ | G06F/1/20 |
| JP | 410093274 A | * | 4/1998 | ............ | H05K/7/20 |

* cited by examiner

*Primary Examiner*—Darren Schuberg
*Assistant Examiner*—Michael Datskovsky
(74) *Attorney, Agent, or Firm*—Blake, Cassels & Graydon LLP

(57) ABSTRACT

A housing for electronic equipment having a cooling air flow passage system of first and second parts. The first part receives incoming cooling air, the air flowing through the first part and then, at one location, flowing from the first part into and then along the second part of the system. At a second location, some of the cooling air is returned into the first part of the system, the remainder of the cooling air having been expelled from the housing. Because of the return of cooling air into the first part of the system, there is an accumulation of incoming and returned air to pass along the first part of the system and this accumulation is greater than the rate at which air is entering and is being expelled from the housing. As a result, the accumulation of air travels at an extremely high flow rate through the first part of the system so as to maximize the removal of heat from electronic components. The electronic equipment may be densely populated with electronic components while the cooling air system maintains desired operating temperatures within the equipment. A method of removing heat from electronic equipment is also discussed.

43 Claims, 4 Drawing Sheets

COOLING OF ELECTRONIC EQUIPMENT

FIELD OF THE INVENTION

This invention relates to the cooling of electronic equipment.

BACKGROUND OF THE INVENTION

Electronic equipment conventionally comprises a housing containing electronic circuitry. In use, electronic components of such circuitry generate heat which, unless dissipated, may cause overheating of individual components, thereby resulting in their malfunction or complete breakdown. To remove this generated heat, a cooling air flow is introduced in which cooling air is forced past the circuitry including the electronic components. In a typical type of electronic equipment, the housing contains shelves each of which is provided with receiving stations to hold electronic circuitry units in side-by-side relationship. Each of such units comprises at least one printed circuit board carrying a plurality of electronic components which project into a cooling air flow passage between that particular printed circuit board and an adjacent board. Cooling air is introduced into the housing through an air inlet and is driven or drawn by fan devices through the cooling air flow passages between boards and then out from the housing through an air outlet. In this way, heat collected by the cooling air is expelled into the outside environment.

The above method of removing heat from electronic components has been generally satisfactory in the past. However, advancing technology is now enabling electronic circuitry to be designed in which conductors and electronic components are more densely positioned upon boards whereby greater quantities of heat are generated over set time periods by unitary areas of circuitry. Such rates of increase in heat generation require accompanying rates of increase in heat removal. One criteria for the rate of heat removal is the velocity of cooling air through the air flow passages. The conventional methods of producing cooling air flow have not been found particularly adequate in removing heat at required rates from electronic circuitry as the density of the circuitry, particularly the density of electronic components, increases. Should the flow rate for air be increased in an attempt to remove heat at the required increased rate, then increased resistance is found as provided at the inlet and outlet and by any air filter which is present. This obviously detracts from the requirement for increased air flow and places a limit upon the maximum air flow rate through the equipment.

SUMMARY OF THE INVENTION

The present invention seeks to provide a housing for electronic equipment and a method of passing cooling air through electronic equipment in a housing and which at least lessens the above problem.

According to the present invention, there is provided a housing for electronic equipment comprising:

an inlet into the housing for cooling air;

a cooling air flow passage system within the housing, the passage system comprising a first part of the system and a second part of the system connected to the first part at:

a) a first location downstream along the first part of the system from the inlet for the flow of cooling air from the first to the second part of the system; and b) a second location upstream along the first part of the system from the first location for return flow to and recirculation of cooling air along the first part of the system; an outlet for expulsion from the system of cooling air containing heat; and a device for generating a flow of cooling air through the inlet and through the passage.system and cause expulsion of a portion of the cooling air from the outlet and the simultaneous flow of the remainder of the cooling air from the second to the first part of the system to mix with cooling air entering through the inlet and flow along the first part of the system.

In use of housings according to the invention, there is an air exchange volumetric flow rate, i.e the rate at which cooling air is exhausted from the outlet and is replaced by fresh cooling air entering through the inlet. However, because of the recirculation design of the passage system, cooling air returns to the first part of the system from the second part to add to cooling air entering the system, whereby the volumetric flow rate of cooling air along the first part of the system must be greater than the volumetric flow rate of air entering the housing. As a result, for this volume of air to travel along the first part of the system, the air flow speed must be greater than in a housing structure having comparable inlet, outlet and cooling air flow generating device, while being devoid of a recirculation feature as in structures of the invention.

Hence, a structure of housing is made possible by the invention in which the air exchange volumetric flow rate is less that the volumetric flow rate through the first part of the system, thereby resulting in increased air flow speed past electronic components positioned in the first part of the system. The recirculatory arrangement thus enables the use of an acceptable and minimal size for the inlet and outlet, thereby maximizing the space available in the housing for electronic circuitry while increased air flow speed is also provided for cooling purpose. As a result, there is an increase in rate of heat removal from electronic components mounted within the first part of the system thereby allowing for increase in density of electronic components.

In a practical arrangement, the first and second parts of the passage system lie parallel with a barrier of the housing separating these parts, the barrier extending between the first and second locations in the housing. The barrier may conveniently comprise an interconnecting plane for electrically connecting electronic circuitry units in the first part of the system to other electronic circuitry units in the second part.

While the passage system may be oriented in any desirable fashion, conveniently it is ideally oriented with both the first and second passage parts extending vertically so that the interconnecting plane is also vertically disposed. In this arrangement, the inlet and outlet may conveniently be located one at an upper region of the housing and the other at a lower region, with preferably the inlet being at the upper region. In this latter case, the first location of interconnection of the first and second passage parts is disposed at the lower region whereas the second location is disposed at the upper region. At the lower region, the cooling air flow generating means may also be located. The generating means may, of course, be disposed in any other desirable position of the passage system. Also, either the inlet or outlet may be disposed in positions other than those mentioned above. For instance, with the inlet located at the upper region of the housing for flow of air downwardly along the first part of the system, the outlet may be disposed in a central or upper region of the second part of the system. In this case the total volume of air moving through the first part of the system and through the air flow generating device continues also along the second part of the system until it reaches the outlet. With this arrangement, some of the cooling air is expelled while the remainder continues along the second part of the system for recirculation into the first part.

With constructions according to the invention, the opening for air at either the inlet or outlet, or both, may be adjustable to vary the air exchange volumetric flow rate. Such adjustment would provide a resultant change in volumetric flow rates through different parts of the system.

The invention also includes a method of cooling electronic equipment comprising:

causing cooling air to flow through an inlet and along a first part of a passage system and between electronic circuitry units located within the first part of the system;

causing at least some of the cooling air to flow, at a first location, from the first part and into and along a second part of the passage system;

causing some of the cooling air to pass from the equipment out from an air outlet and, at a second location, causing some of the cooling air to return to the first part from the second part of the passage system; and allowing the cooling air returning to the first part from the second part of the passage system to mix with cooling air entering through the inlet to provide a volumetric flow rate of air passing through the first part of the system which is greater than the volumetric flow rate of cooling air entering through the inlet.

BRIEF DESCRIPTION OF THE DRAWINGS

One embodiment of the invention will now be described, by way of example, with reference to the accompanying drawings, in which.

DESCRIPTION OF THE EMBODIMENT

Figure 1:
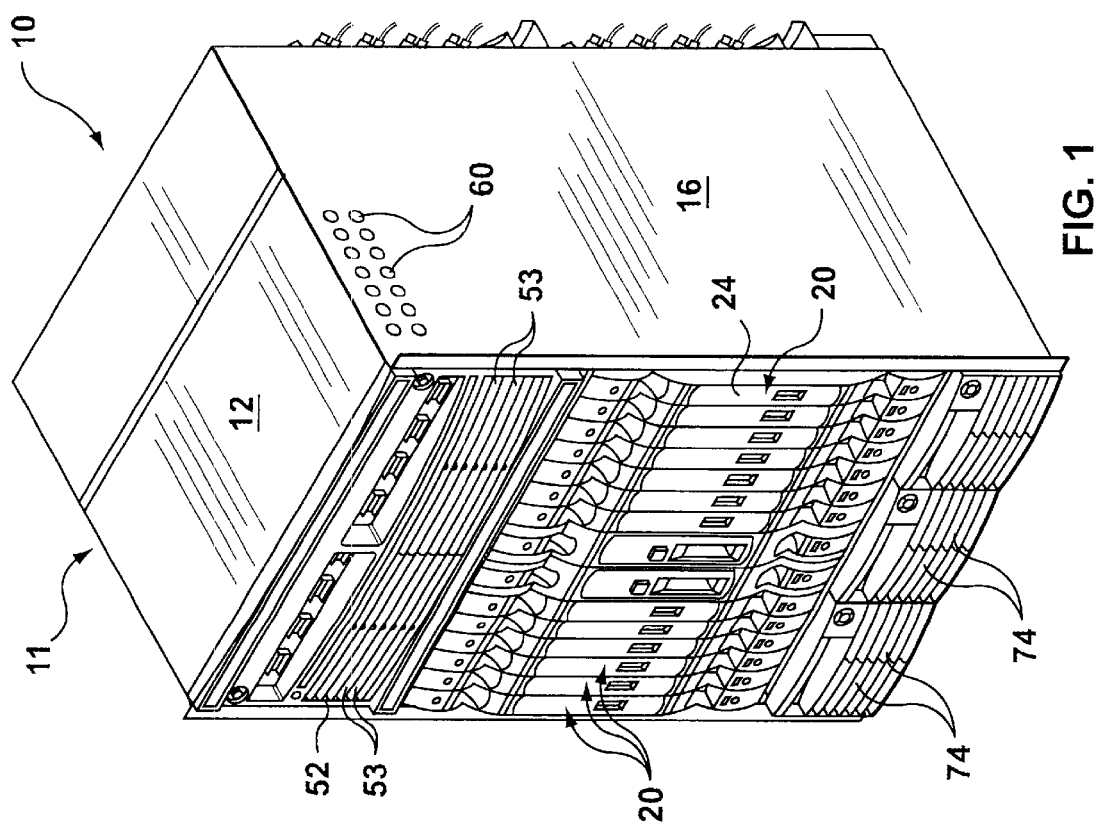
FIG. 1 is an isometric view of the front of electronic equipment and incorporating a housing according to the embodiment.

As shown by the Figures, an electronic equipment 10 comprises a vertically oriented generally rectangular housing 11 comprising upper wall 12, lower wall 14 (FIGS. 4 and 5) and side walls 16. The housing has a front, as viewed from FIG. 1, for the sliding reception of vertically oriented electronic circuitry units into receiving stations of the housing, the receiving stations provided in conventional fashion by upper and lower horizontal guides 22 (see FIG. 6). Each electronic circuitry unit is in the form of a circuit pack 20. Each circuit pack 20 has a faceplate 24 facing forwardly from the front of the housing and a vertically positioned printed circuit board 26 (see FIG. 5). The printed circuit board carries a plurality of electronic components 28 which are connected together by electrical conductors 30 carried by the board. The drawings (e.g. FIG. 5) show a minimal amount of the components 28 and conductors 30 merely for information purposes.

Figure 2:
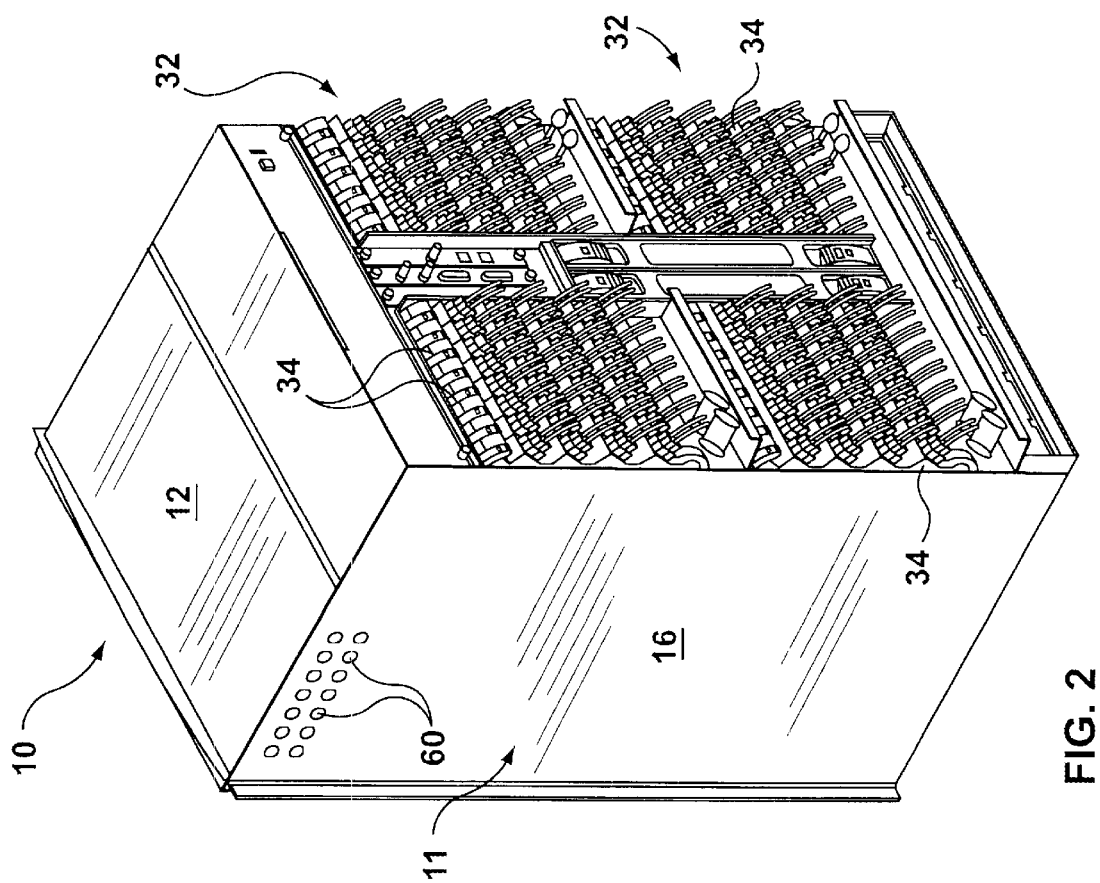
FIG. 2 is an isometric view of the rear of the electronic equipment and housing of the embodiment.
Figure 5:
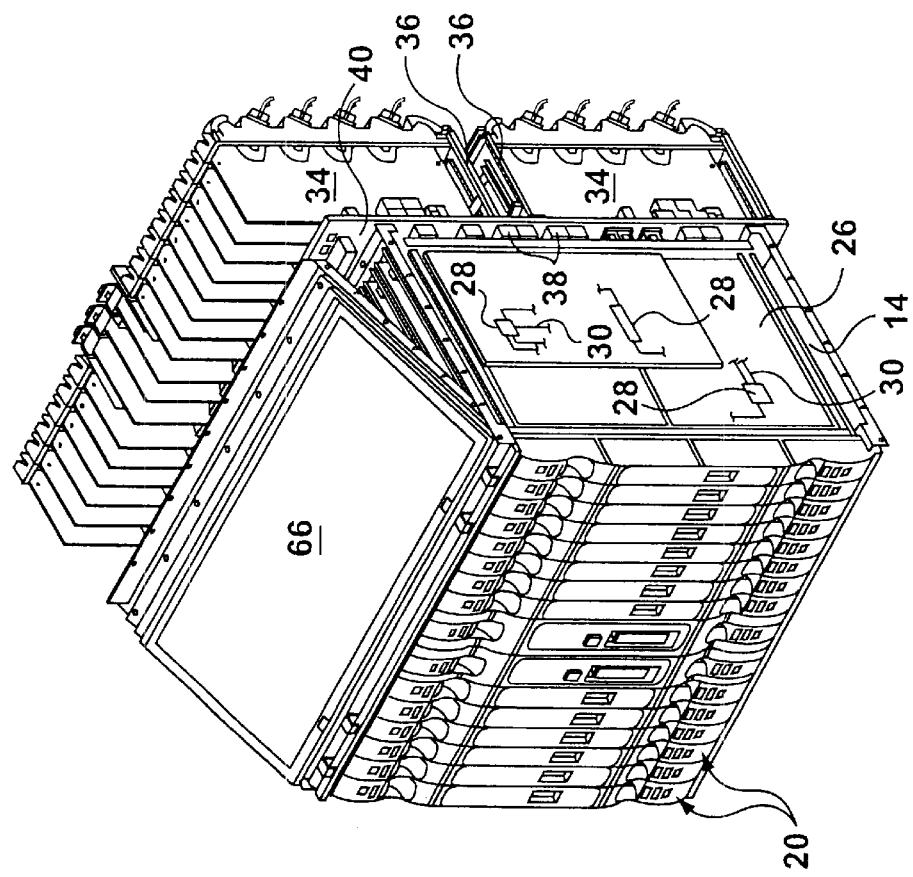
FIG. 5 is an isometric view in the same direction as FIG. 1 with an outside casing of the housing removed.
Figure 6:
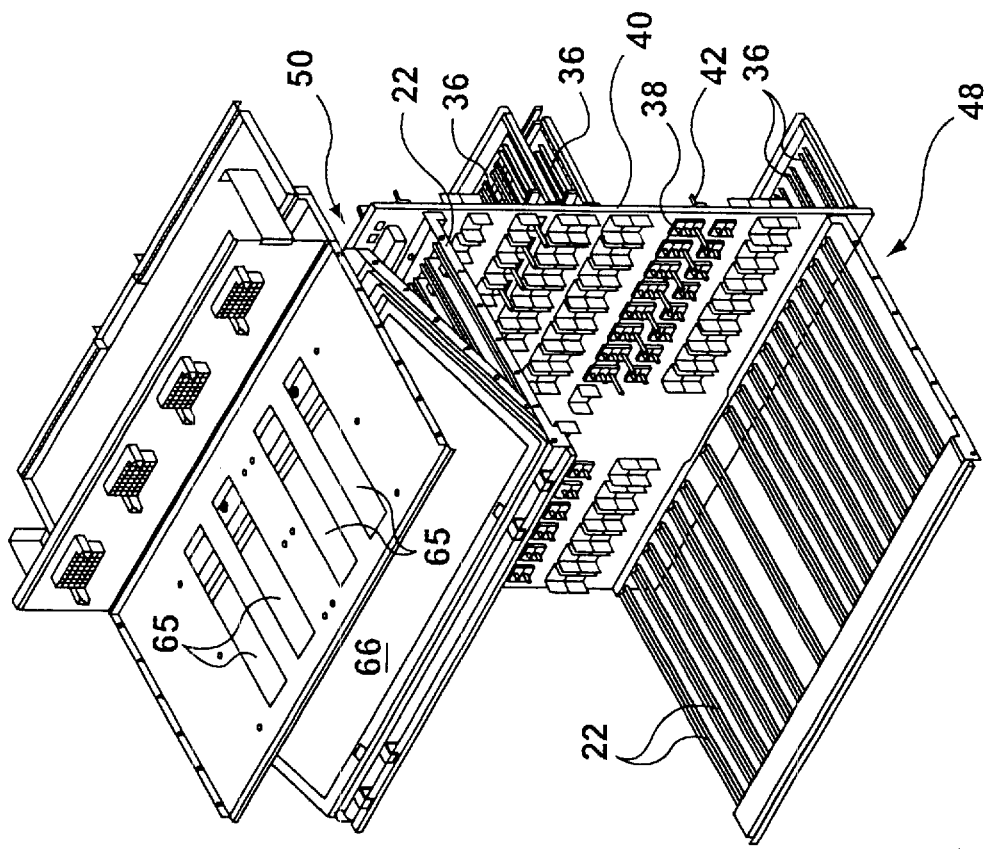
FIG. 6 is a view similar to FIG. 5 devoid of electronic circuitry units to show detail.

At the rear, as shown by FIG. 2, the housing receives two tiers 32 of input/output cards 34 which are received within receiving stations through the rear of the housing, the receiving stations provided by upper and lower horizontal guides 36 (see FIGS. 5 and 6). The circuit packs 20, when in their receiving stations, are electrically interconnected by connectors 38 into a vertical interconnecting plane 40 (conventionally referred to as a mid-plane) with further connectors 42 at a rear of the plane and which are connected to the input/output cards 34. The printed circuit boards 26 and cards 34 are thus interconnected as required to complete the electronic circuitry of the equipment.

Figure 7:
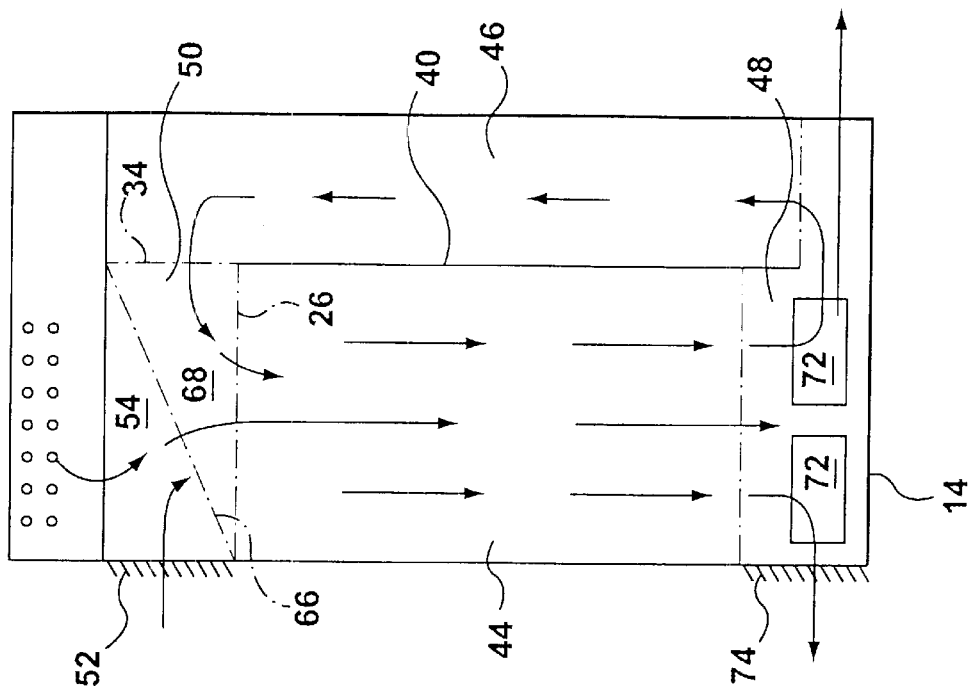
FIG. 7 is a flow diagram of cooling air through the equipment shown in a diagrammatic vertical cross-sectional view.

The housing also has a passage system for the flow of cooling air through the equipment. This passage system generally comprises a first part of the system along which cooling air initially flows and a second part of the system for flow of cooling air from the first part of the system, the cooling air then returning from the second to the first part of the system. More specifically, as shown by FIG. 7, the first part 44 of the system extends vertically downwards in front of the interconnecting plane 40 so that cooling air passes over the printed circuit boards 26 (FIG. 5) and over the electronic components mounted on the boards. The second part 46 of the system is located behind the interconnecting plane 40 so that the two parts lie side by side with the interconnecting plane forming a barrier between them.

Figure 4:
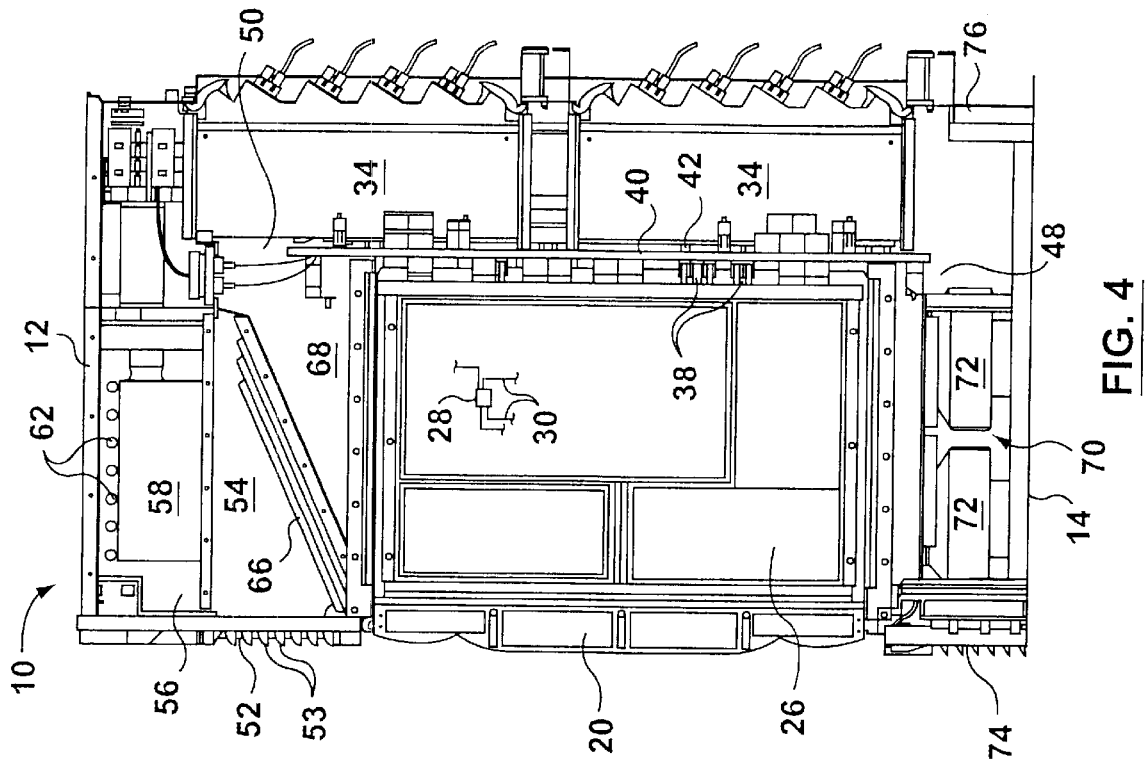
FIG. 4 is a diagrammatic vertical cross-sectional view through the equipment.

The housing is distinct in that the first and second parts of the passage system are interconnected at the lower end region of the housing, i.e. at location 48, as shown by FIGS. 4 and 7, and also at an upper end region of the housing shown generally at location 50.

A discussion of the flow of cooling air throughout the equipment now follows. FIG. 7 shows, by arrows, cooling air flow direction and is referred to throughout the following discussion.

Figure 3:
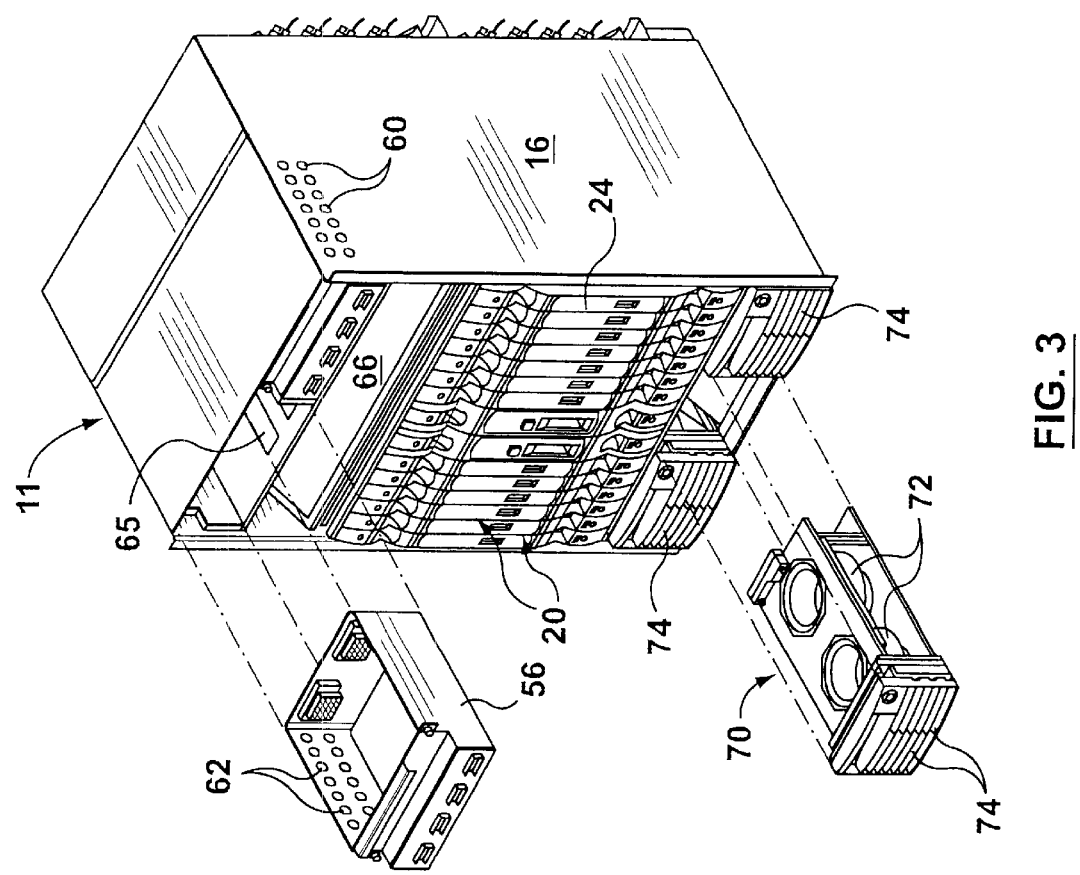
FIG. 3 is a partly exploded isometric view in the same direction as FIG. 1.

At an upper end region at the front of the housing is provided a horizontally elongate opening 52 for cooling air to enter the housing (FIGS. 1, 4 and 7), the opening having horizontal louvers 53. These may be adjustable for varying the size of the opening for passage of air. Air entering through the opening 52 passes into a cooling air receiving chamber 54, shown particularly by FIG. 4. Above the receiving chamber 54 the housing has a station which detachably receives two power entry modules 56 (FIG. 3) each of which carries power units 58 as shown diagrammatically in FIG. 4. In the upper regions of the sides 16 of the housing is provided a plurality of cooling air inlet openings 60 (FIGS. 1, 2 and 3) for cooling air also to pass through these openings and then through openings 62 (FIG. 3) in the sides 64 of the power entry modules, this incoming air then passing downwardly through apertures 65 (FIG. 6) in the housing to the air receiving chamber 54. Hence, the air inlet openings 52 and 60 in combination provide an inlet into the housing for cooling air. The cooling air received into chamber 54 then passes through an air filter 66 (FIGS. 3, 4, 5 and 6) to proceed to an air mixing region 68 before proceeding downwardly along the first part 44 of the passage system.

At a lower end region of the housing is located a device 70 for generating flow of cooling air through the passage system. This device comprises a plurality of fans 72 disposed beneath the first part 44 of the passage system and generally at the location 48 interconnecting the first part of the system to the second part 46. The fans are driven about vertical axes and operate to draw air downwardly through the first part 44 of the passage system, this air then being forced partly through a louvered outlet opening 74 at the front of the housing, partly through an outlet opening 76 of honeycomb structure at the rear of the housing and partly up the second part 46 of the passage system. As may be seen, because of the unique interconnection at the two in-series locations 48 and 50 between the first and second parts of the passage system, then the air which is being driven up the second part 46 must pass through the location 50 to return to and then be recirculated along the first part. In this embodiment, as may be seen particularly from FIGS. 4 and 7, the position of the air mixing region 68 is such that the air returning to the first part 44 from the second part 46 of the passage system must pass through the region 68. The region 68 also receives fresh cooling air from the cooling air receiving chamber 54, as already discussed, and thus the region 68 serves to mix the fresh cooling air and the air returning from the second part 46 of the passage system.

In use of the electronic equipment 10, the fans 72 draw air through the air inlet opening 52 into the air receiving chamber 54 simultaneously with air flowing through the inlet openings 60, through the power module 56 and into the air receiving chamber. This air then flows through the air filter 66 and into the air mixing region 68 to mix with cooling air from the second part 46 of the system as mentioned above and to be discussed in greater detail below. The air mixture is then drawn along the first part 44 of the passage system. The air then passes from the first part of the passage system through the cooling air flow generating device 70. The fans 72 drive a percentage of the air out from the outlet openings 74 and 76 at the lower end region of the housing, while the remainder of the air is driven upwards through the second part 46 of the passage system. Hence, as the cooling air proceeds down the first part 44 of the passage system, it serves to remove heat from the printed circuit boards 26 and from the electronic circuitry carried by the boards including the electronic components 28. In passing through the second part 46 of the passage system the cooling air removes heat from the input/output cards 34.

Upon reaching the upper regions of the second part 46 of the passage system, the cooling air then immediately flows over the interconnecting plane 40 and into the air mixing region 68 so as to mix with incoming air entering the chamber through the filter 66 from the air receiving chamber 54. Thus the heated air passing over the interconnecting plane is cooled by this mixing effect. The transfer of air into the first part from the second part of the passage system results in a greater volume of air being fed into the air mixing region 68 than is received into the housing through the inlet openings 52 and 60 into the air receiving chamber 54. As a result, the volumetric flow rate of air flowing down the first part 44 of the passage system is greater than that of the incoming air into the chamber 54. Thus, the speed of the cooling air passing down the first part 44 of the system is greater than could possibly be the case if air were being drawn in to equipment to flow through the equipment in a single pass before exiting through an outlet. This greater air velocity causes an increased flow of cooling air to pass over the circuitry in the first part of the system, particularly over the electronic components, so that heat removal from the electronic components is far greater than would otherwise be possible. With this arrangement, a greater rate of heat removal enables the equipment to be provided with maximized density of electronic components upon the electronic units, while ensuring that the electronic components do not overheat and continue to work within favorable operating temperatures.

In summary therefore from the above, as shown by the embodiment, that in providing for return of some of the cooling air from the second part to the first part of the passage system for recirculation purposes, greater rate of heat removal is made possible. This is effected without the need for a corresponding increase in air flow through the inlet and outlet and through the filter 66.

In the particular embodiment described above, in a test measurements were made for air flow throughout the equipment. To simplify the test, the cooling air inlet openings 60 were closed off so that cooling air was allowed to enter only through the horizontally elongate opening 52. The air exchange volumetric flow rate, i.e. the air entering cooling air receiving chamber 54 and the corresponding air expelled from the outlet openings 74 and 76, was easily ascertained. This was performed by connecting a wind tunnel to the inlet opening 52 and measuring the volumetric flow rate through the tunnel. However, the flow rates within the equipment could not be measured directly, i.e. the flow rate down the first passage part 44 and the flow rate up the second passage part 46. The flow rates within the equipment were ascertained by two stages of test.

In the first stage, and with velocity probes located at the intakes of the fans 72, the second part 46 of the passage system was closed off to air flow. This then converted the passage system into a conventional system in which all of the cooling air flowed once through the inlet, down the first passage part 44 and out from the outlet. Hence, the volumetric flow rate of cooling air passing through the fans 72 would equal the air exchange volumetric flow rate. Cooling air was then passed through the system. Readings by the air velocity probes of air velocity at the fans 72 thus corresponded to the measured volumetric flow rate through the wind tunnel and entering the equipment. With this relationship between air velocity at the fans and incoming volumetric flow rate ascertained, the second stage of operation was then performed.

In the second stage, the second passage part 46 was open for air flow through it and for air flow to return to the first passage part 44 at location 50. Cooling air was then drawn through the total system by the fans 72 and volumetric flow rate through the wind tunnel was again measured and readings of air velocity taken from the air velocity probes. By employing the now known relationship between air velocity at the fans and incoming volumetric flow rate, as determined during the first stage of the test, the volumetric flow rate of cooling air through the fans was then determined from the new air velocity readings. This flow rate through the fans was the summation of the volumetric flow rate of incoming cooling air into and through the cooling air receiving chamber 54 and the volumetric flow rate of air re-entering the first passage part 44 from the second part 46.

The above test showed the following results for volumetric air flow rates through the equipment and with the second passage part 46 open for air flow. Incoming air flowing through the inlet opening 52 had a volumetric flow rate of 499 cubic feet per minute (cfm). Air at this flow rate was thus received from the air receiving chamber 54 into the mixing region 68. Thus, the air exchange volumetric flow rate is 499 cfm, i.e. the total quantity of cooling air emitted from the outlets 74 and 76 must equal that being received in the chamber 54. From the air velocity readings of the air velocity probes at the fans 72, it was determined that the volumetric flow rate of air passing through the fans and thus down the first passage part 44 was 788 cfm. This was a total of the 499 cfm referred to above and the air being driven up the second passage part 46 and into the mixing region. From this, the cooling air being driven up the second passage part 46 was determined to be 289 cfm for cooling the input/output cards 34. As may be seen from these results, the actual flow speed of the air through the first part 44 of the passage system is substantial.

The above structure of the embodiment included printed circuit boards having extremely densely positioned electronic components 28. To ensure that the structure operated adequately for maintaining acceptable operating temperatures within the system, and by using the above confirmed flow rates, temperatures at specific positions throughout the system were predicted. Air entering into the air receiving chamber 54 had a temperature of approximately 55 degrees centigrade which was ambient temperature at 1800 meters altitude. This air then passed into the air mixing region 68 and the predicted temperature of the mixed air in the region 68 was approximately 62 degrees centigrade. After the air had progressed to the lower end of the first part 44 of the passage system its temperature was predicted to be approximately 73 degrees centigrade which was maintained in the air as it was being emitted through the outlets 74 and 76 and in the air entering the lower end of the second part 46 of the passage system. The air temperature midway up the second part 46 of the passage was predicted to be approximately 76 degrees centigrade and at upper regions of the second part 46, immediately before entering the mixing region 68, the air temperature was predicted to be approximately 79 degrees centigrade. Predicted operating temperatures throughout the equipment were found to be acceptable.

Further advantages are also found with the particular structure described in the embodiment. Where the louvers 53 at the inlet openings 52 are adjustable this enables the air transfer to be adjusted as required and, louvers at the outlet 74 may also be adjusted for the same reason.

In addition, the first and second parts of the passage system are designed to accommodate required sizes and numbers of printed circuit boards and input/output cards 34. As may be seen, the cards 34 which require to be in two tiers 32 as discussed, need to be higher than the single tier of printed circuit boards in the first part of the passage system. For this purpose, the second part 46 of the system extends further upwards than the first part 44 to overlap the air incoming chamber 54 and the air mixing region 68 thereby minimizing the total height of the equipment.

While the embodiment shows the positioning of the air inlet and outlet at top and bottom regions of the housing, such is not necessarily the case. For instance, as shown in a modification of the embodiment in FIG. 8, which is a flow diagram of the cooling air, while the fans 72 remain at a lower end of the housing together with the outlet opening 74, a further outlet opening 80 is disposed at the top end region of the second part 46 of the passage system. This outlet opening 80 is a replacement for the outlet opening 76 in the embodiment.

Figure 8:
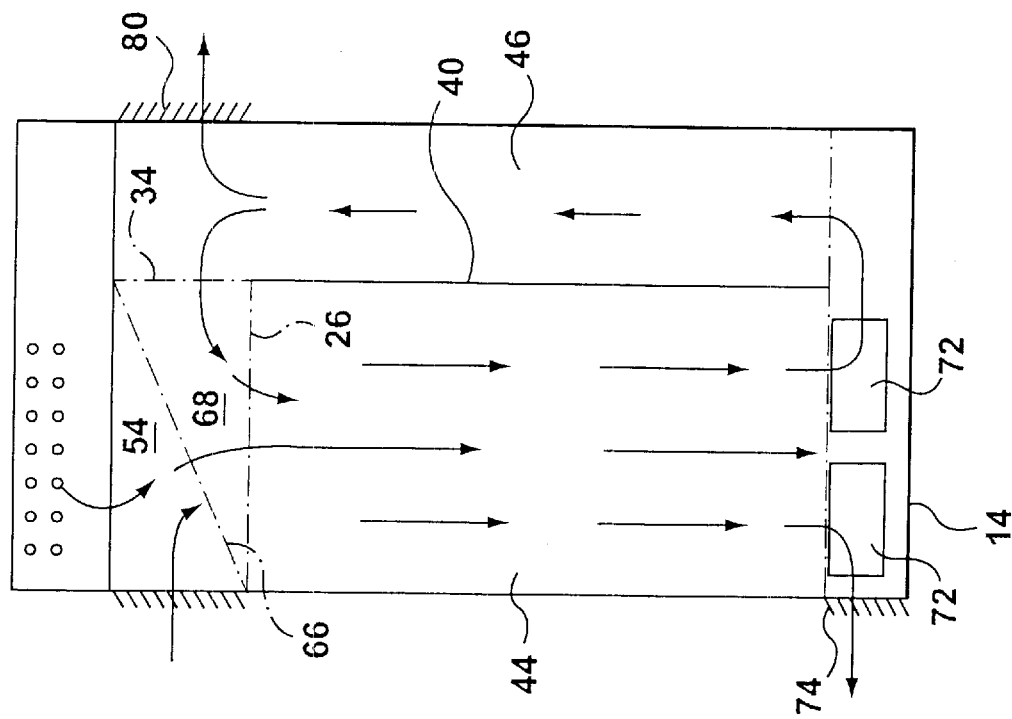
FIG. 8 is a view similar to FIG. 7 of electronic equipment and showing a modification of the embodiment.

It follows that in use of the modification of FIG. 8, some of the cooling air is expressed through the outlet opening 74 while the remainder of the air then proceeds up the second part 46 of the passage, some of this remainder then being removed through the outlet opening 80. Cooling air that is still present in the second part 46 is then returned to the mixing region 68 for recirculation down the first part 44 of the passage.

In a further modification (not shown) a single outlet opening at a top region of the second part 46 of the passage system is used and both of the outlet openings 74 and 76 are dispensed with.

What is claimed is:

1. A housing for electronic equipment comprising:

an inlet into the housing for cooling air;

a cooling air flow passage system within the housing, the passage system comprising a first part of the system and a second part of the system connected to the first part at:
  (a) a first location downstream along the first part of the system from the inlet for the flow of cooling air from the first to the second part of the system; and
  (b) a second location upstream along the first part of the system from the first location for return flow to and recirculation of cooling air along the first part of the system;

an outlet for expulsion from the system of cooling air containing heat; and a device for generating a flow of cooling air through the inlet and through the passage system and for causing expulsion of a portion of the cooling air from the outlet and the simultaneous flow of the remainder of the cooling air from the second part to the first part of the system to mix with cooling air entering through the inlet and flowing along the first part of the system;

wherein the first and second parts of the passage system are each provided with a plurality of receiving stations for electronic circuits and an interconnecting plane is provided with the first and second parts of the passage system disposed one upon each side of the interconnecting plane, the interconnecting plane carrying, on each of its sides, a plurality of electrical connectors at receiving stations with electrical connectors at receiving stations on one side of the interconnecting plane being electrically interconnected through the plane with electrical connectors at receiving stations on the other side of the plane.

2. A housing according to claim 1, wherein the cooling air inlet and the second location are disposed at the upper end region of the housing with the first part of the system extending downwardly to the first location at the lower end region of the housing and with the interconnecting plane extending vertically between first and second parts of the system, and the cooling air flow generating device is also disposed at the lower end region of the housing.

3. A housing according to claim 2 wherein the cooling air flow generating device is disposed at the first location to receive cooling air from the first part of the passage system and to expel the portion of cooling air from the outlet, which is located to receive the cooling air prior to the air reaching the second part of the system.

4. A housing according to claim 1, wherein the cooling air flow generating device is disposed at one of the first and second locations at which the first and second parts of the passage system are interconnected.

5. A housing for electronic equipment comprising:

an inlet into the housing for cooling air;

a cooling air flow passage system within the housing, the passage system comprising a first part of the system and a second part of the system connected to the first part at:
  (a) a first location downstream along the first part of the system from the inlet for the flow of cooling air from the first to the second part of the system; and (b) a second location upstream along the first part of the system from the first location for return flow to and recirculation of cooling air along the first part of the system;

an outlet for expulsion from the system of cooling air containing heat; and a device for generating a flow of cooling air through the inlet and through the passage system and for causing expulsion of a portion of the cooling air from the outlet and the simultaneous flow of the remainder of the cooling air from the second part to the first part of the system to mix with cooling air entering through the inlet and flowing along the first part of the system;

wherein the housing defines a cooling air receiving chamber upstream of the first part of the passage system for delivering air into the first part of the passage system, the housing also having a station for receiving a power module, and the inlet comprises a first inlet opening for entry of a portion of incoming cooling air to the cooling air receiving chamber and a second opening for entry of another portion of incoming cooling air through the power module receiving station and to the cooling air receiving chamber.

6. A housing according to claim 5 wherein the cooling air receiving chamber is disposed upstream, in direction of air flow, from the second location to cause cooling air being delivered from the chamber to mix at the second location with cooling air returning to the first part from the second part of the passage system.

7. A housing according to claim 6, wherein an air mixing region is provided at the second location, the first part of the passage system, cooling air receiving chamber and mixing region, being disposed in alignment, and the second part of the passage system extends alongside and is separated from the first part of the system by a barrier, the second part of the system extending beyond the first part of the system to overlap the air receiving chamber and the mixing region, and the second part of the system has its receiving stations overlapping the air receiving chamber and mixing region.

8. A housing according to claim 7, wherein the cooling air inlet, the cooling air receiving chamber and mixing region are disposed at an upper region of the housing with the first part of the passage system extending downwardly to the first location at the lower end region of the housing, and with the barrier extending vertically between first and second parts of the system, and the cooling air flow generating device is also disposed at the lower end region of the housing.

9. A housing according to claim 8, wherein the first and second parts of the passage system are each provided with a plurality of receiving stations for receiving electronic circuits and the barrier comprises an interconnecting plane with the first and second parts of the passage system disposed one upon each side of the interconnecting plane, the interconnecting plane carrying, on each of its sides, a plurality of electrical connectors at receiving stations with electrical connectors at receiving stations on one side of the interconnecting plane being electrically interconnected through the plane with electrical connectors at receiving stations on the other side of the plane.

10. A method of cooling electronic equipment comprising:

causing cooling air to flow through an inlet and along a first part of a passage system and between electronic circuitry units located within the first part of the system;

causing at least some of the cooling air to flow, at a first location, from the first part and into and along a second part of the passage system;

causing some of the cooling air to pass from the equipment out from an air outlet and, at a second location, causing some of the cooling air to return to the first part from the second part of the passage system;

allowing the cooling air returning to the first part from the second part of the passage system to mix with cooling air entering through the inlet to provide a volumetric flow rate of cooling air passing through the first part of the passage system which is greater than the volumetric flow rate of cooling air entering through the inlet; and causing incoming cooling air to flow through a first inlet opening of the inlet to a cooling air receiving chamber and causing cooling air to flow also through a second inlet opening of the inlet and through a power module receiving station to the cooling air receiving chamber, and then causing the cooling air to flow from the cooling air receiving chamber into the first part of the passage system.

11. A method according to claim 10, comprising causing the incoming cooling air to flow into and through an air mixing region prior to the cooling air flowing into the first part of the passage system, and causing the cooling air from the second part of the passage system to flow into the air mixing region to mix with the incoming cooling air flowing into the air mixing region.

12. A method according to claim 11, comprising causing some of the cooling air to pass out from the equipment from the air outlet at the first location and also causing the remainder of the cooling air to pass from the first location into and along the second part of the passage system.

13. A method of cooling electronic equipment comprising:

causing cooling air to flow through an inlet and along a first part of a passage system and between electronic circuitry units located within the first part of the system;

causing at least some of the cooling air to flow, at a first location, from the first part into and along a second part of the passage system and between electronic circuitry units located within the second part of the system;

causing some of the cooling air to pass from the equipment out from an air outlet and, at a second location, causing some of the cooling air to return to the first part from the second part of the passage system; and allowing the cooling air returning to the first part from the second part of the passage system to mix with cooling air entering through the inlet to provide a volumetric flow rate of cooling air passing through the first part of the passage system which is greater than the volumetric flow rate of cooling air entering through the inlet.

14. A housing for electronic equipment comprising:

an inlet for receiving cooling air;

a cooling air flow passage in fluid communication with the inlet, the passage including a first part thereof for cooling a first set of electronic circuitry units and a second part thereof for cooling a second set of electronic circuitry units, the first part of the cooling air flow passage being in fluid communication with the second part thereof at a first location downstream of said inlet and at a second location downstream of the first location;

an outlet for exhausting cooling air, the outlet being in fluid communication with the cooling air flow passage, the outlet being located in the first part of the cooling air flow passage; and an apparatus for encouraging flow of cooling air within the cooling air flow passage, the apparatus being operable to cause drawing of cooling air through the inlet at an inflow rate and to cause exhausting of cooling air through the outlet, the apparatus being further operable to cause cooling air to flow through the first part of the cooling air flow passage along the first set of electronic circuitry units at a first flow rate to thereby remove heat from the first set of electronic circuitry units, wherein at least a portion of the cooling air from the first part of the cooling air flow passage is encouraged to flow into the second part thereof at the first location along the second set of electronic circuitry units to thereby remove heat from the second set of electronic circuitry units, and wherein at least a portion of the cooling air from the second part of the cooling air flow passage is encouraged to return into the first part thereof at the second location such that the first flow rate is greater than the inflow rate.

15. The housing according to claim 14, wherein the outlet is located closer to the first location than to the inlet.

16. The housing according to claim 15, wherein the outlet is located in proximity to the first location.

17. The housing according to claim 14, wherein the housing further includes a second outlet for exhausting from the second part of the cooling air flow passage said portion of the cooling air from the first part of the cooling air flow passage encouraged to flow into the second part thereof.

18. The housing according to claim 17, wherein the second outlet is located downstream of the first location closer to the second location than to first location.

19. The housing according to claim 18, wherein the second outlet is located in proximity to the second location.

20. The housing according to claim 17, wherein the second outlet is located, upstream of the second location closer to the first location than to the second location.

21. The housing according to claim 20, wherein the second outlet is located in proximity to the first location.

22. The housing according to claim 14, further comprising a barrier defining the cooling air flow passage, the first part of the cooling air flow passage being disposed on a first side of the barrier, and the second part of the cooling air flow passage being disposed on a second side thereof opposite the first side.

23. The housing according to claim 22, wherein the barrier is an interconnecting plane having receiving stations on either side thereof, the receiving stations on the first side being provided to locate the first set of electronic circuitry units, and the receiving stations on the second side being provided to locate the second set of electronic circuitry units.

24. The housing according to claim 23, further comprising first and second sets of electronic circuitry units, each set of electronic circuitry units being connected to its respective receiving stations, the first set of electronic circuitry units being electrically interconnected through the interconnecting plane with the second set of electronic circuitry units.

25. A housing for electronic equipment comprising:
an inlet for receiving cooling air;
a cooling air flow passage in fluid communication with the inlet, the passage including a first part thereof for cooling a first set of electronic circuitry units and a second part thereof for cooling a second set of electronic circuitry units, the second part of the cooling air flow passage being in fluid communication with the first part thereof;
an outlet for exhausting cooling air, the outlet being in fluid communication with the cooling air flow passage;
a station for receiving a power module, the station having an opening defined therein for receiving cooling air;
a chamber located downstream of the inlet, the chamber being in fluid communication with the inlet, with the station and with the first part of the cooling air flow passage; and
an apparatus for encouraging flow of cooling air within the cooling air flow passage, the apparatus being operable:
   a) to cause drawing of cooling air through the inlet at an inflow rate and to cause exhausting of cooling air through the outlet,
   b) to cause the chamber to receive cooling air from the inlet and through the opening in the station, and
   c) to cause cooling air to flow through the first part of the cooling air flow passage along the first set of electronic circuitry units at a first flow rate to thereby remove heat from the first set of electronic circuitry units, wherein at least a portion of the cooling air from the first part of the cooling air flow passage is encouraged to flow through the second part thereof and along the second set of electronic circuitry units to thereby remove heat from the second set of electronic circuitry units, and wherein at least a portion of the cooling air from the second part of the cooling air flow passage is encouraged to return into the first part thereof such that the first flow rate is greater than the inflow rate.

26. The housing according to claim 25, further comprising an air filter disposed between the chamber and the first part of the cooling air flow passage.

27. The housing according to claim 26, wherein the cooling air flow passage has an air mixing region defined therein, the region being disposed in the housing so as to receive said portion of cooling air returning into the first part of the cooling air flow passage from the second part thereof and so as to receive cooling air entering from the chamber.

28. A housing for electronic equipment comprising:
an inlet for receiving cooling air;
a generally planar barrier having first and second terminal ends and defining a cooling air flow passage, the cooling air flow passage being in fluid communication with the inlet, the cooling air flow passage including a first part thereof disposed adjacent a first side of the barrier for cooling a first set of electronic circuitry units located on said first side and a second part thereof disposed adjacent a second side of the barrier opposite the first side thereof for cooling a second set of electronic circuitry units located on said second side, the second part of the cooling air flow passage being in fluid communication with the first part thereof adjacent each terminal end of the barrier;
an outlet for exhausting cooling air, the outlet being in fluid communication with the cooling air flow passage; and
an apparatus for encouraging flow of cooling air within the cooling air flow passage, the apparatus being operable to cause drawing of cooling air through the inlet at an inflow rate and to cause exhausting of cooling air through the outlet, the apparatus being further operable to cause cooling air to flow through the first part of the cooling air flow passage along the first side of the barrier at a first flow rate to thereby remove heat from the first set of electronic circuitry units, wherein at least a portion of the cooling air from the first part of the cooling air flow passage is directed to move along a first generally U-shaped flow path defined about the first terminal end of the barrier, into the second part of the cooling air flow passage and along the second side of the barrier to thereby remove heat from the second set of electronic circuitry units, and wherein at least a portion of the cooling air from the second part of the cooling air flow passage is directed to move along a second generally U-shaped flow path defined about the second terminal end of the barrier to return into the first part of the cooling air flow passage to merge with the cooling air flowing therethrough such that the first flow rate is greater than the inflow rate.

29. The housing according to claim 28, wherein the barrier is an interconnecting plane having receiving stations on either side thereof, the receiving stations on the first side being provided to locate the first set of electronic circuitry units, and the receiving stations on the second side being provided to locate the second set of electronic circuitry units.

30. The housing according to claim 29, further comprising first and second sets of electronic circuitry units, each set of electronic circuitry units being connected to its respective receiving stations, the first set of electronic circuitry units being electrically interconnected through the interconnecting plane with the second set of electronic circuitry units.

31. The housing according to claim 28, wherein the outlet is located in the first part of the cooling air flow passage.

32. The housing according to claim 28, wherein the outlet is located in the second part of the cooling air flow passage.

33. The housing according to claim 28, wherein the first part of the cooling air flow passage is in fluid communication with the second part thereof at a first location downstream of said inlet and at a second location downstream of the first location.

34. The housing according to claim 33, wherein the apparatus is disposed adjacent one of the first and second locations.

35. The housing according to claim 33, wherein the outlet is located in proximity to the first location.

36. The housing according to claim 33, wherein the outlet is located in proximity to the second location.

37. The housing according to claim 33, wherein the outlet is located in the first part of the cooling air flow passage closer to the first location than to the inlet.

38. The housing according to claim 33, wherein the outlet is located in the second part of the cooling air flow passage closer to the first location than to the second location.

39. The housing according to claim 28, wherein the outlet is a first outlet and the housing includes a second outlet.

40. The housing according to claim 29, wherein the first and second outlets are located in the second part of the cooling air flow passage.

41. The housing according to claim 29, wherein the first outlet is located in the first part of the cooling air flow passage and the second outlet is located in the second part of the cooling air flow passage.

42. The housing according to claim 41, wherein the first part of the cooling air flow passage is in fluid communication with the second part thereof at a first location downstream of said inlet and at a second location downstream of the first location;

the first outlet is located in proximity to the first location; and the second outlet is located in proximity to the second location.

43. The housing according to claim 41, wherein the first part of the cooling air flow passage is in fluid communication with the second part thereof at a first location downstream of said inlet and at a second location downstream of the first location; and the first and second outlets are located in proximity to the first location.

\* \* \* \* \*